(12) United States Patent
Lee et al.

(10) Patent No.: US 8,907,380 B1
(45) Date of Patent: Dec. 9, 2014

(54) RADIATION TOLERANT DUMMY GATE-ASSISTED N-MOSFET, AND METHOD AND APPARATUS FOR MODELING CHANNEL OF SEMICONDUCTOR DEVICE

(71) Applicant: Korea Advanced Institute of Science and Technology, Daejeon (KR)

(72) Inventors: Hee-Chul Lee, Daejeon (KR); Min-Su Lee, Daejeon (KR)

(73) Assignee: Korea Advanced Institute of Science, Daejeon (KR)

( * ) Notice: Subject to any disclaimer, the term of this patent is extended or adjusted under 35 U.S.C. 154(b) by 0 days.

(21) Appl. No.: 14/101,505

(22) Filed: Dec. 10, 2013

(30) Foreign Application Priority Data

Jun. 28, 2013 (KR) .................. 10-2013-0075282
Aug. 14, 2013 (KR) .................. 10-2013-0096865

(51) Int. Cl.
*H01L 29/66* (2006.01)
*H01L 29/423* (2006.01)
*H01L 29/78* (2006.01)

(52) U.S. Cl.
CPC ............ *H01L 29/4238* (2013.01); *H01L 29/78* (2013.01)

USPC .......................................... 257/194; 257/349

(58) Field of Classification Search
USPC ................................. 257/297, 349
See application file for complete search history.

(56) References Cited

U.S. PATENT DOCUMENTS

| | | | |
|---|---|---|---|
| 6,521,487 B1 * | 2/2003 | Chen et al. ................... | 438/133 |
| 2003/0155600 A1 * | 8/2003 | Shiau et al. .................. | 257/297 |
| 2007/0105387 A1 * | 5/2007 | Blatchford et al. .......... | 438/710 |

* cited by examiner

*Primary Examiner* — Lex Malsawma
(74) *Attorney, Agent, or Firm* — Lexyoume IP Meister, PLLC

(57) ABSTRACT

The DGA n-MOSFET layout of the present invention can properly operate in a radioactive environment by blocking leakage current paths that may be created by radiation. Hence, the DGA n-MOSFET layout can be applied to design of electronic components operable in radioactive environments, such as outer space, planetary exploration, and in nuclear reactors in nuclear power plants. In addition, semiconductor design efficiency can be increased by enabling rapid modeling of electrical characteristics of a semiconductor device such as a DGA MOSFET when the channel region geometry is diversified according to design of the semiconductor device.

7 Claims, 16 Drawing Sheets

C-C'

C-C'

US 8,907,380 B1

RADIATION TOLERANT DUMMY GATE-ASSISTED N-MOSFET, AND METHOD AND APPARATUS FOR MODELING CHANNEL OF SEMICONDUCTOR DEVICE

BACKGROUND OF THE INVENTION

1. Field of the Invention

The present invention relates to a radiation tolerant unit metal oxide semiconductor field effect transistor (MOSFET) and a method and apparatus for modeling a channel of a semiconductor device. More particularly, the present invention relates to a radiation tolerant dummy gate-assisted (DGA) unit MOSFET wherein the transistor layout of a unit MOSFET is modified so that the unit MOSFET is resistant to radiation, and to a method and apparatus for modeling a channel of a semiconductor device that can enhance semiconductor design efficiency by enabling rapid modeling of electrical characteristics of the channel region of a semiconductor device such as a DGA MOSFET when the channel geometry is varied according to design of the semiconductor device.

2. Description of the Related Art

When a unit MOSFET (metal oxide semiconductor field effect transistor) is exposed to radiation for a long time, leakage current is induced and turn-off operation of the MOSFET may be blocked. Hence, electronic components operated in radioactive environments (such as outer space, planetary exploration, and in nuclear reactors in nuclear power plants) must be resistant to radiation.

In typical circuit design, operating characteristics of a semiconductor circuit are determined by adjusting the width over length (W/L) ratio of a semiconductor device. For example, to design a circuit using a unit MOSFET having a given channel region geometry, it is necessary to develop a model with an effective W/L ratio suitable for the channel region geometry. However, an analytical solution for a desired channel region geometry may not exist. In this case, only numerical analysis using a computer may be utilized. Designing and computing a channel region model with a specific geometry on a three-dimensional simulator may require a lot of time and effort. Circuit design may need various types of semiconductor devices with different structures, and hence it may be practically infeasible to perform three-dimensional simulation for each unit semiconductor device for realistic circuit design.

RELATED ART DOCUMENTS

Patent Documents (patent document 1) KR10-0526046 B1

SUMMARY OF THE INVENTION

The present invention has been made in view of the above problems. Accordingly, an aspect of the present invention is to provide a radiation tolerant dummy gate-assisted unit n-MOSFET that can properly operate in a radioactive environment by blocking generation of leakage current due to accumulated radiation effects when exposed to radiation for a long time.

Another aspect of the present invention is to provide a method and apparatus for modeling a channel of a semiconductor device that can enhance semiconductor design efficiency by enabling rapid modeling of electrical characteristics of a unit semiconductor device when the channel geometry is varied according to design of the unit semiconductor device such as DGA MOSFET.

In accordance with an aspect of the present invention, there is provided a dummy gate-assisted n-MOSFET having radiation tolerance characteristics. As a unit n-MOSFET that includes an N-active layer designating an active area of the transistor so that an isolation field oxide is not formed in the active area during a process, a poly gate layer designating a gate region of the transistor using poly silicon, and an n+ layer designating highly doped positions of n-type to form the source and the drain through self-alignment, the dummy gate-assisted n-MOSFET includes: a dummy poly gate layer to block leakage current paths by use of a phenomenon that hole trapping is not generated when the thickness of the gate oxide becomes less than or equal to 10 nm; and a p-active layer and a p+ layer to block generation of leakage current by raising a threshold voltage so as to suppress channel inversion caused by trapped holes, wherein the source and the drain of the transistor are enclosed by the dummy poly gate layer, the p-active layer and the p+ layer so as to block radiation-induced leakage current paths.

In a feature of the present invention, the dummy gate-assisted n-MOSFET (DGA n-MOSFET) layout can properly operate in a radioactive environment by blocking leakage current paths that may be created by radiation. Hence, the DGA n-MOSFET layout can be applied to design of electronic components operable in radioactive environments, such as outer space, planetary exploration, and in nuclear reactors in nuclear power plants.

In addition, when the geometry of a channel region becomes diverse due to practical extension thereof as in the case of radiation tolerant DGA n-MOSFETs whose channel region geometry is diverse, an analytical solution for the W/L ratio of the channel region may be not obtainable and hence the W/L ratio may have to be computed through simulation-based numerical analysis. The present invention proposes an effective W/L ratio model for approximating the W/L ratio in the above situation, thereby enabling practical circuit design using unit semiconductor devices having diverse channel region geometries such as radiation tolerant DGA n-MOSFETs.

BRIEF DESCRIPTION OF THE DRAWINGS

The features and advantages of the present invention will be more apparent from the following detailed description in conjunction with the accompanying drawings, in which.

DETAILED DESCRIPTION OF EXEMPLARY EMBODIMENTS

Hereinafter, exemplary embodiments of the present invention are described in detail with reference to the accompanying drawings. Particular terms may be defined to describe the invention in the best manner. Accordingly, the meaning of specific terms or words used in the specification and the claims should not be limited to the literal or commonly employed sense, but should be construed in accordance with the spirit of the invention. The description of the various embodiments is to be construed as exemplary only and does not describe every possible instance of the invention. Therefore, it should be understood that various changes may be made and equivalents may be substituted for elements of the invention.

The terms first, second, A, B, (a), (b) and the like in the description or in the claims are used to distinguish between similar elements and do not necessarily describe a sequential or chronological order. Similarly, the term "connected", "coupled", "linked" or the like should not be interpreted as being restricted to direct connections only. For example, the expression "a component A connected to a component B" may not only mean that the component A is directly connected to the component B but also mean that the component A is connected to the component B through some other component or means. It may mean that there exists a path between the components A and B where the path involves other components or means.

First, a brief description is given of basic principles of the present invention.

Figure 1:
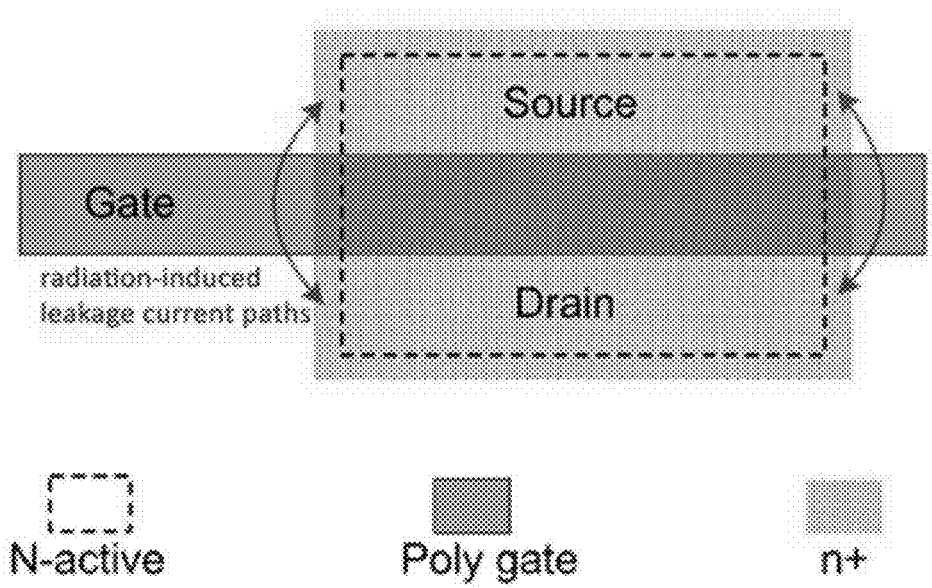
FIG. 1 illustrates an existing commercial n-MOSFET layout.

FIG. 1 illustrates an existing commercial n-MOSFET layout. The existing commercial n-MOSFET device shown in FIG. 1 is laid out using an N-active layer, a poly gate layer, and an n+ layer. These layers play the following roles. The N-active layer designates an active area of the transistor so that an isolation field oxide is not formed in the active area during a process. The poly gate layer designates a gate region of the transistor using poly silicon. The n+ layer designates highly doped positions of n-type to form the source and the drain through self-alignment.

In the following description, the unit MOSFET of the present invention is referred to as a radiation tolerant dummy gate-assisted n-MOSFET (DGA n-MOSFET). Compared with an existing enclosed layout transistor (ELT), the DGA n-MOSFET enables achievement of a width over length ratio less than or equal to 2.26, and has lower gate capacitance and area consumption. Additionally, in terms of source/drain asymmetry, the DGA n-MOSFET exhibits more symmetric behavior than the ELT.

In the present invention, to realize radiation resistance characteristics, a dummy poly gate layer 20, dummy metal-1 layer 10, p-active layer and p+ layer 30 are used. Each of these layers aids in blocking of leakage current paths, which may be induced by radiation, in a DGA n-MOSFET, realizing radiation tolerance of the DGA n-MOSFET.

Figure 2:
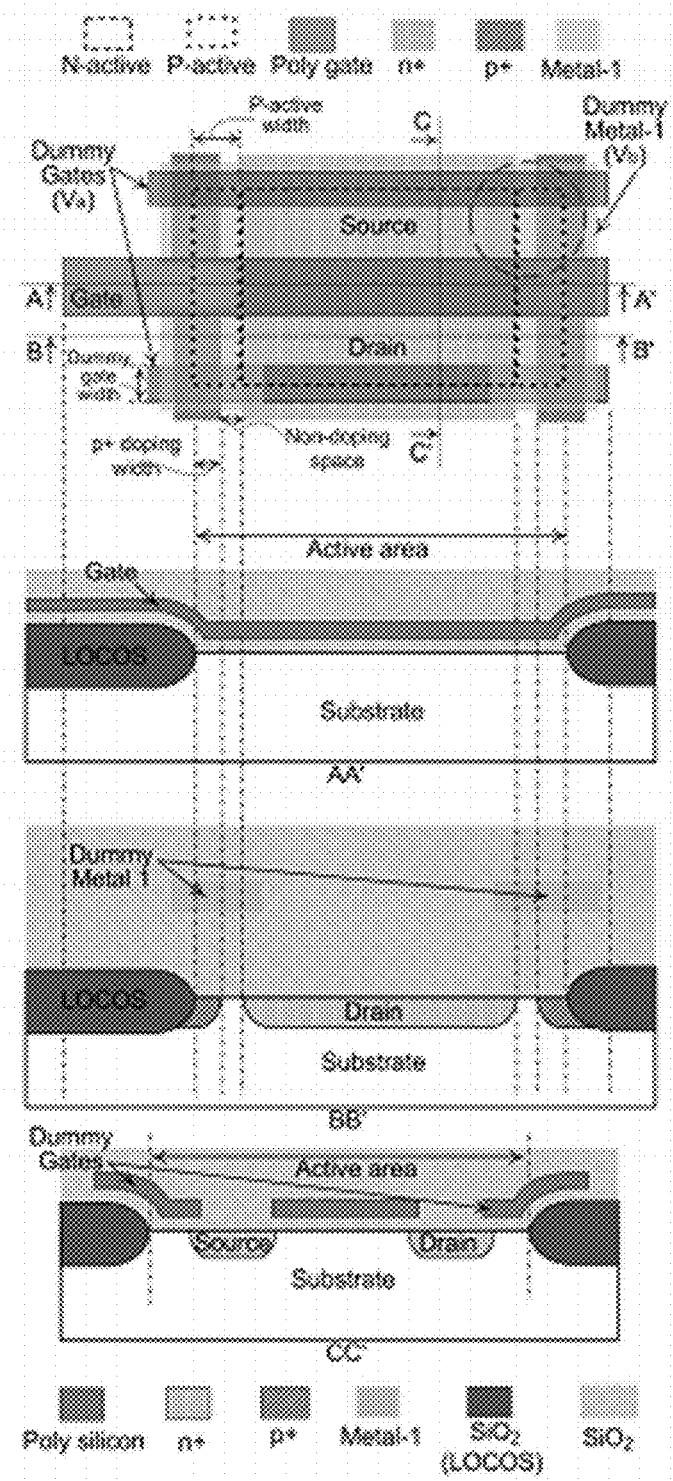
FIG. 2 illustrates a radiation tolerant DGA n-MOSFET layout according to an embodiment of the present invention.
Figure 3:
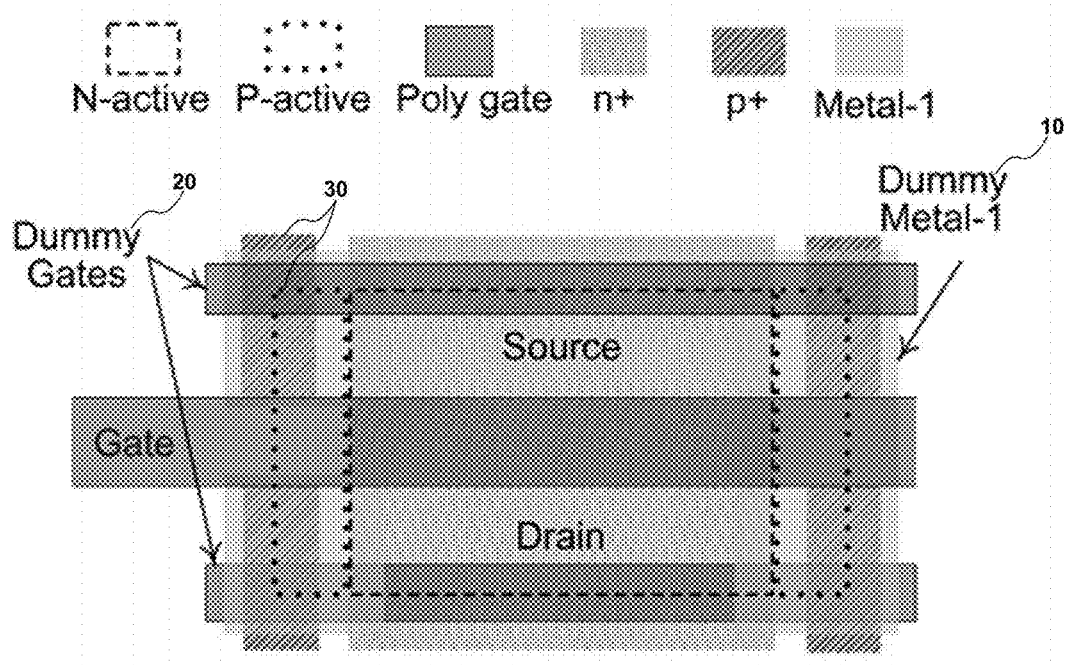
FIG. 3 illustrates a radiation tolerant DGA n-MOSFET layout to which a dummy poly gate layer 20, p-active layer and p+ layer 30, and dummy metal-1 layer 10 are all applied.

FIG. 2 illustrates a radiation tolerant DGA n-MOSFET layout according to an embodiment of the present invention. FIG. 3 illustrates a radiation tolerant DGA n-MOSFET layout to which a dummy poly gate layer 20, p-active layer and p+ layer 30, and dummy metal-1 layer 10 are all applied.

In comparison to an existing commercial n-MOSFET layout shown in FIG. 1, the present invention adds three types of layers.

First, a dummy metal-1 layer 10 is included to suppress generation of leakage currents by applying a flat band voltage to minimize the electric field acting on the oxide, which results in recombination of most electron-hole pairs generated by radiation.

Second, a dummy poly gate layer 20 is included to block leakage current paths by making the thickness of the gate oxide less than or equal to 10 nm so that hole trapping is not generated.

Third, a p-active layer and p+ layer 30 are included to block generation of leakage current by raising the threshold voltage to suppress channel inversion caused by trapped holes.

In the present invention, a new radiation tolerant n-MOSFET is designed using a layout modification technique. The layout modification technique aims to modify the layout of a transistor so as to impart radiation resistance to the transistor, and allows direct application of existing, modern commercial semiconductor fabrication processes. The unit n-MOSFET of the present invention (DGA n-MOSFET) was developed using a layout modification technique.

The radiation tolerant DGA n-MOSFET of the present invention utilizes three effects described below.

First, when the electric field acting on the oxide of the transistor is weak, electron-hole pairs generated by radiation do not separate but recombine, decreasing hole trapping occurring between the oxide and substrate interface. To utilize this effect, the dummy metal-1 layer 10 is included in the present invention. That is, a flat band voltage is applied to the dummy metal-1 layer 10 so that the electric field acting on the oxide between the dummy metal-1 layer 10 and the substrate becomes zero.

Second, when the thickness of the oxide becomes less than or equal to about 10 nm, leakage current is not generated owing to absence of hole trapping. In the event that the oxide is sufficiently thin, although electron-hole pairs may be generated by radiation, holes are not trapped at the interface between the oxide and substrate owing to tunneling. Hence, as holes are not trapped, radiation does not cause leakage current. To utilize this effect, the dummy poly gate layer 20 is included in the present invention. A gate oxide is placed between the dummy poly gate layer 20 and the substrate. When a submicron semiconductor fabrication process is used, the thickness of the gate oxide becomes less than or equal to 10 nm. Therefore, use of the dummy poly gate layer 20 may aid in blocking leakage current.

Third, high p-type doping (p+) on the silicon substrate may raise the threshold voltage, and hence a channel is not induced. To generate channel inversion in the transistor, a voltage greater than or equal to the threshold voltage must be applied to the gate region. High p-type doping may raise the threshold voltage. Trapped holes generated by radiation lower the threshold voltage, and high p-type doping raises the threshold voltage. Hence, the influence of radiation may be cancelled out. To utilize this effect for leakage current blocking, the p+ layer 30 is included in the present invention.

Figure 4:
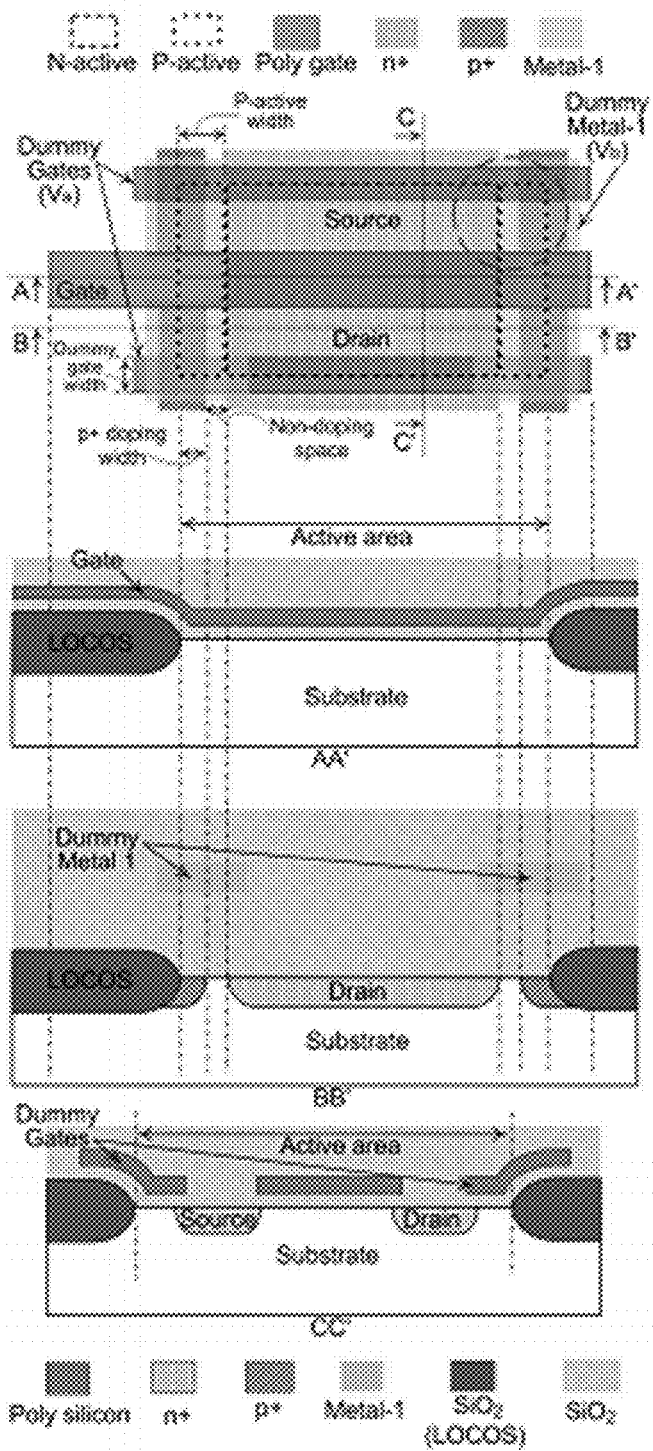
FIG. 4 is cross sectional views of selected portions of the DGA n-MOSFET layout shown in FIG. 3.

FIG. 4 is cross sectional views of selected portions of the DGA n-MOSFET layout shown in FIG. 3. As shown in FIG. 4, cross sectional views are related with usage of LOCOS (LOCal Oxidation of Silicon) field isolation. Even if shallow trench isolation (STI) is used instead of field isolation, the DGA n-MOSFET still exhibits radiation tolerance.

As shown in FIG. 4, each cross sectional view indicates that the source and the drain are both separated from the side wall oxide by each added layer. Hence, the source and the drain are both blocked from leakage current paths that may be generated at the oxide.

For actual implementation, as the dummy metal-1 layer 10 and the p+ layer 30 are expected to block leakage current at the same position, there may be several cases: the two layers are applied together; only one thereof is applied; and none thereof is applied.

Hence, various embodiments of the present invention may be specified. That is, a first embodiment relates to a case in which the dummy metal-1 layer 10 and the p+ layer 30 are both applied; a second embodiment relates to a case in which only the dummy metal-1 layer 10 is applied; a third embodiment relates to a case in which only the p+ layer 30 is applied; and a fourth embodiment relates to a case in which neither the dummy metal-1 layer 10 nor the p+ layer 30 is applied.

A fifth embodiment relates to a case in which the dummy gate is formed in the active layer. Although the fifth embodiment may be used together with one of the first to fourth embodiments, the fifth embodiment is assumed to be used together with the first embodiment only.

A sixth embodiment relates to a case in which the corner of the dummy gate is bent at a right angle toward the gate so as to extend the dummy gate toward the gate as much as possible. Although the sixth embodiment may be used together with one of the first to fourth embodiments, the sixth embodiment is assumed to be used together with the first embodiment only.

A seventh embodiment relates to a case in which the gate length is reduced at a section of the gate overlapping with the p-active layer. Although the seventh embodiment may be used together with one of the first to sixth embodiments, the seventh embodiment is assumed to be used together with the first embodiment only.

An eighth embodiment relates to a case in which a silicide blocking layer is introduced to prevent conduction between the n-region and p-region of the silicon due to silicide at a portion where the P-active layer and the N-active layer contact each other. Although the eighth embodiment may be used together with one of the first to seventh embodiments, the eighth embodiment is assumed to be used together with the first embodiment only.

A ninth embodiment relates to a case in which the p+ layer 30 is extended to the transistor gate region. When the p+ layer 30 is extended to the transistor gate region, a pn junction is formed at the gate region and turn-off operation of the transistor may be slowed. Hence, extension of the p+ layer 30 to the transistor gate region is generally discouraged. However, such extension may be applied according to the process. Although the ninth embodiment may be used together with one of the first to eighth embodiments, the ninth embodiment is assumed to be used together with the first embodiment only.

First Embodiment

Figure 5:
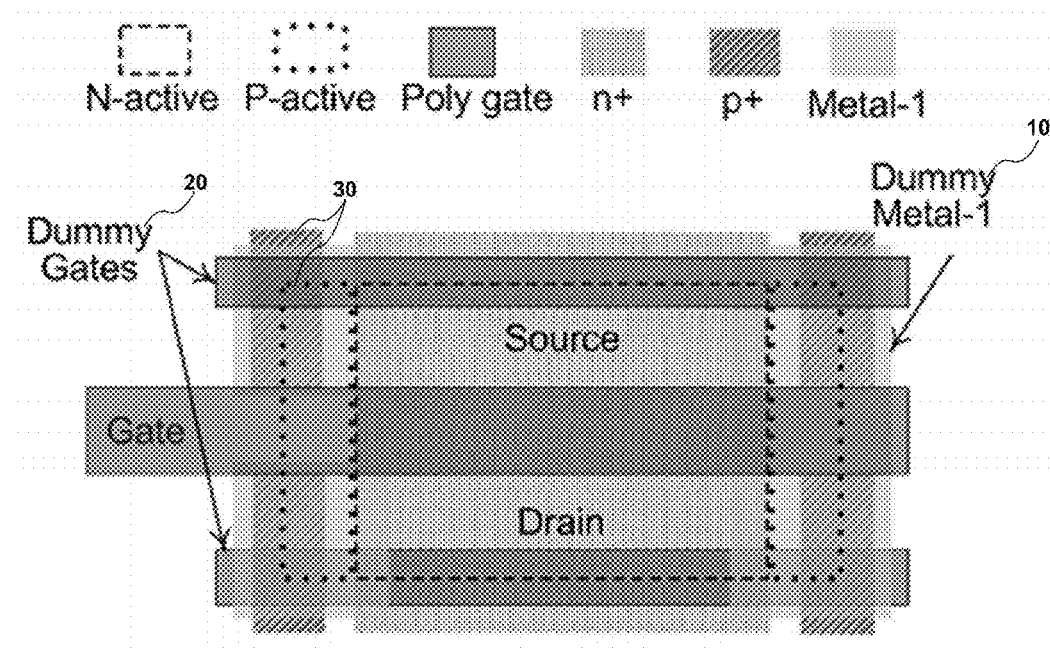
FIG. 5 shows a radiation tolerant DGA n-MOSFET layout according to a first embodiment of the present invention.

FIG. 5 shows a radiation tolerant DGA n-MOSFET layout according to the first embodiment of the present invention.

Referring to FIG. 5, in the first embodiment, the dummy poly gate layer 20, the dummy metal-1 layer 10, and the p-active layer and the p+ layer 30 are all used together as described before. In this case, each of these layers contributes to radiation tolerance, as described before. Particularly, at the p-active layer, the p+ layer 30 and the dummy metal-1 layer 10 may function to provide radiation resistance in an overlapping manner.

Second Embodiment

Figure 6:
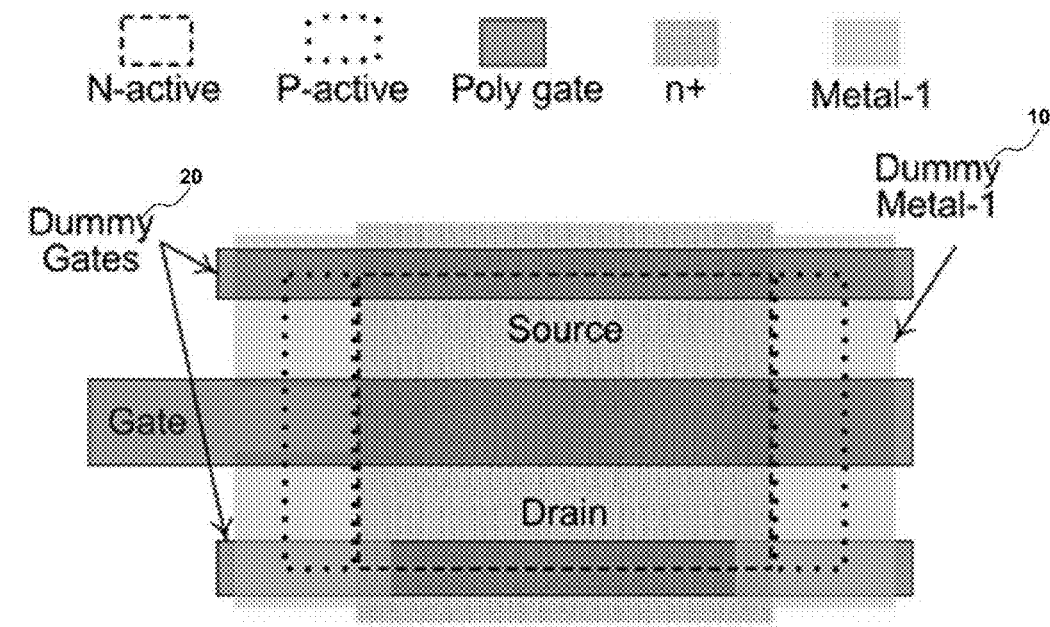
FIG. 6 shows a radiation tolerant DGA n-MOSFET layout according to a second embodiment of the present invention.

FIG. 6 shows a radiation tolerant DGA n-MOSFET layout according to the second embodiment of the present invention.

Referring to FIG. 6, in the second embodiment, only two layers of the dummy poly gate layer 20 and the dummy metal-1 layer 10 are used as described before. At the p-active layer, the dummy metal-1 layer 10 alone may function to impart radiation resistance. As the p+ layer and the dummy metal-1 layer 10 act on the same position, the dummy metal-1 layer 10 may be sufficient for radiation resistance as in the case of the second embodiment.

Third Embodiment

Figure 7:
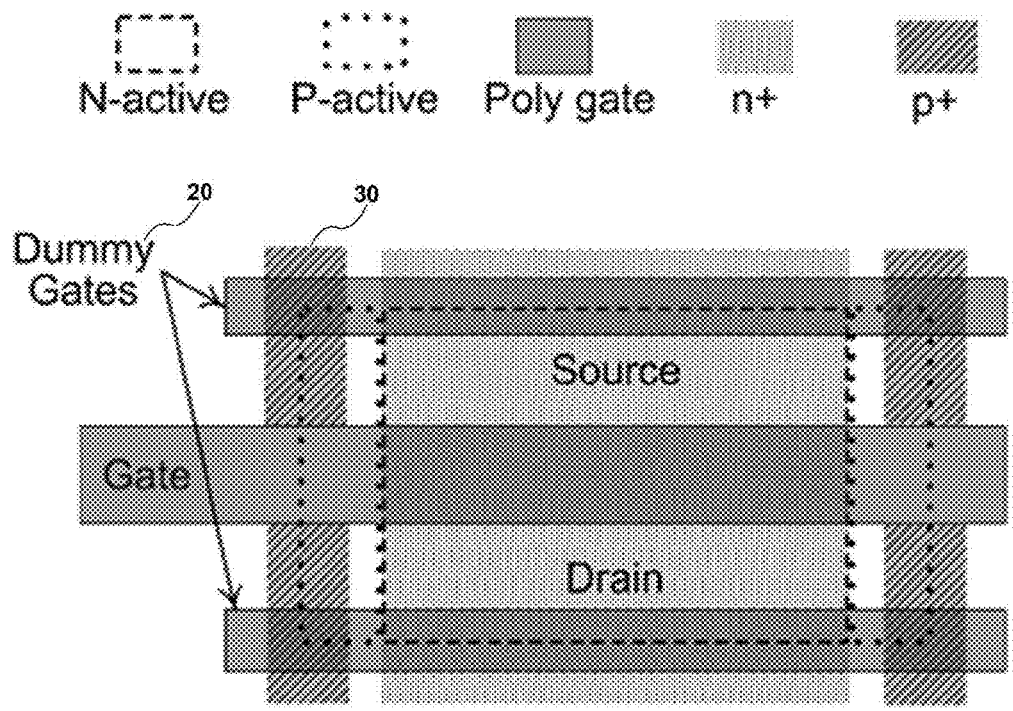
FIG. 7 shows a radiation tolerant DGA n-MOSFET layout according to a third embodiment of the present invention.

FIG. 7 shows a radiation tolerant DGA n-MOSFET layout according to the third embodiment of the present invention.

Referring to FIG. 7, in the third embodiment, only two layers of the dummy poly gate layer 20 and the p+ layer 30 are used as described before. At the p-active layer, the p+ layer 30 alone may function to impart radiation resistance. As the p+ layer 30 and the dummy metal-1 layer act on the same position, the p+ layer 30 may be sufficient for radiation resistance as in the case of the third embodiment.

Fourth Embodiment

Figure 8:
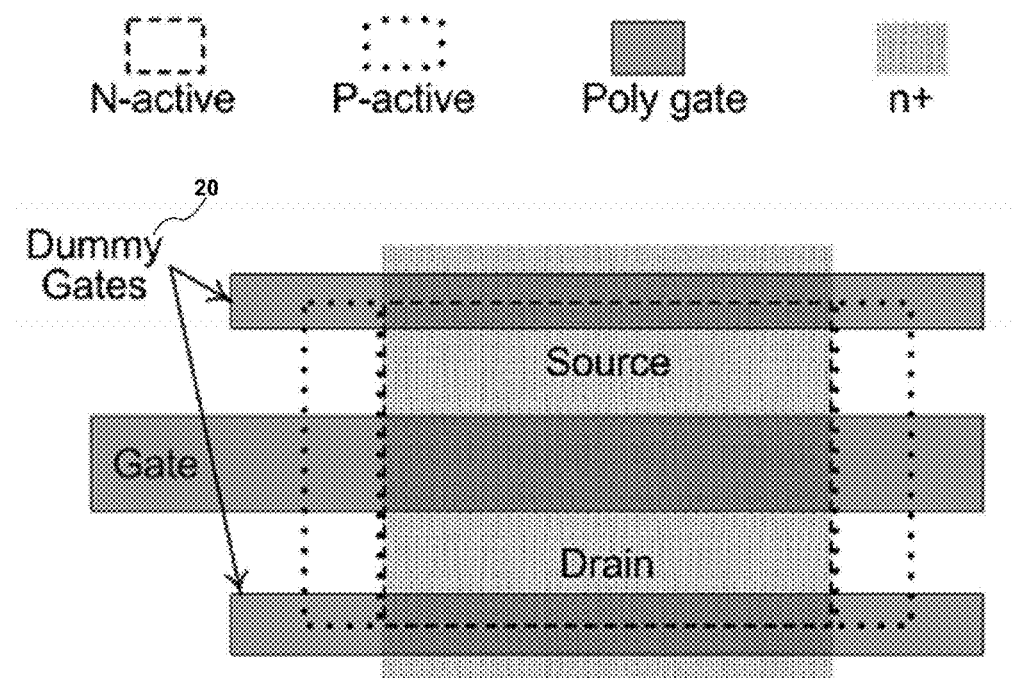
FIG. 8 shows a radiation tolerant DGA n-MOSFET layout according to a fourth embodiment of the present invention.

FIG. 8 shows a radiation tolerant DGA n-MOSFET layout according to the fourth embodiment of the present invention.

Referring to FIG. 8, in the fourth embodiment, only the dummy poly gate layer 20 is used as described before. In specific cases, the p-active layer alone may function to impart radiation resistance without the dummy metal-1 layer and the p+ layer. According to the process employed, a lightly doped drain (LDD) region may be used. In this case, as the p-active layer is p-doped to some degree, the p-active layer may protect against radiation without the dummy metal-1 layer and the p+ layer. Presence of the p-active layer alone without an LDD structure may increase the leakage current path, producing a radiation tolerance effect.

Fifth Embodiment

Figure 9:
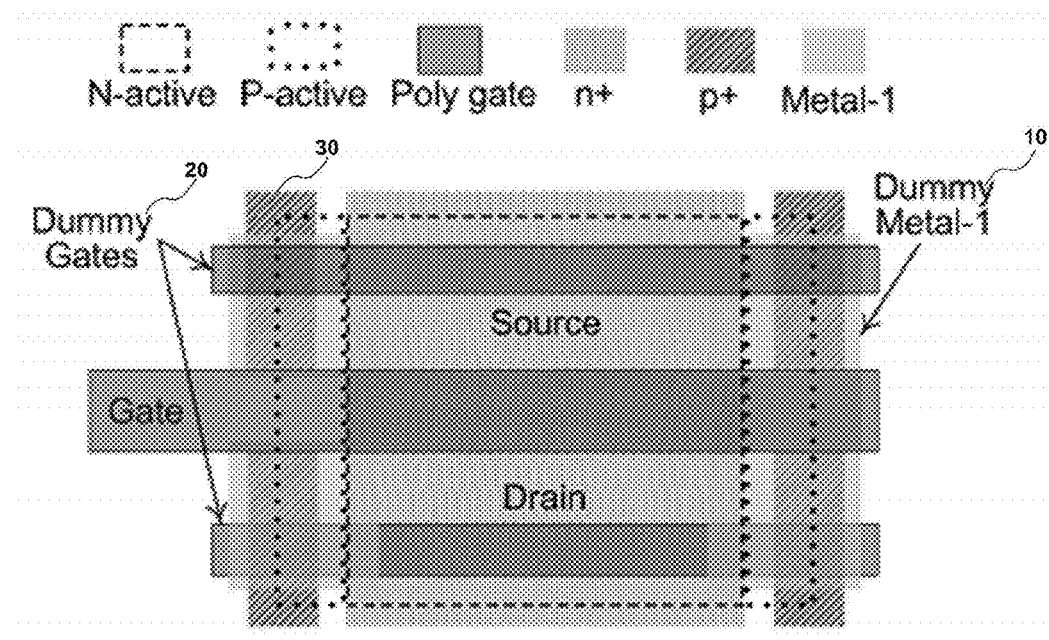
FIG. 9 shows a radiation tolerant DGA n-MOSFET layout according to a fifth embodiment of the present invention.

FIG. 9 shows a radiation tolerant DGA n-MOSFET layout according to the fifth embodiment of the present invention.

Referring to FIG. 9, in the fifth embodiment, the p-active layer and the n-active layer are extended toward the two dummy poly gate layers 20 so that the dummy poly gate layers 20 are placed in the p-active layer and the n-active layer. In this layout, the two dummy poly gate layers 20 still function to impart radiation resistance. Although the p-active layer and the n-active layer are extended in two directions, a thin gate oxide is still used as an oxide under the dummy poly gate layers 20, preserving radiation resistance. Although the layout of the fifth embodiment consumes a wider area in comparison to the layout of the first embodiment, the fifth embodiment may be used when the layout of the first embodiment violates a certain design rule.

Sixth Embodiment

Figure 10:
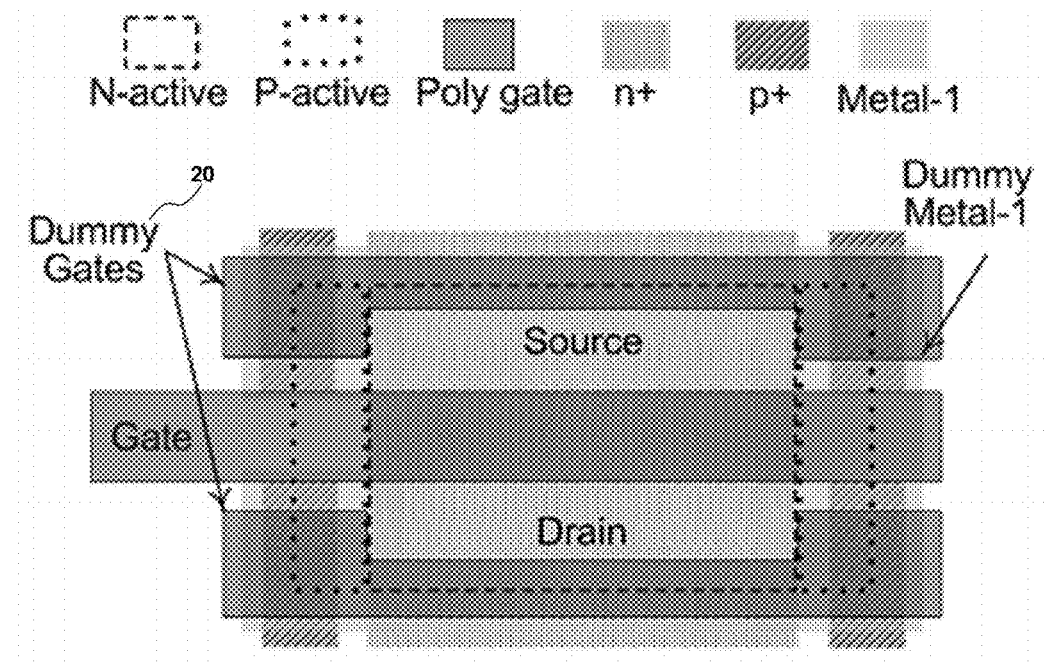
FIG. 10 shows a radiation tolerant DGA n-MOSFET layout according to a sixth embodiment of the present invention.

FIG. 10 shows a radiation tolerant DGA n-MOSFET layout according to the sixth embodiment of the present invention.

Referring to FIG. 10, in the sixth embodiment, the dummy poly gate layer 20 is bent at both corners toward the gate so as to be brought closer to the gate. This layout enables the dummy poly gate layer 20 to provide a wider radiation tolerant region than that provided by the p+ layer. The dummy poly gate layer 20 may be placed close to the gate so long as the corresponding design rule is satisfied.

Seventh Embodiment

Figure 11:
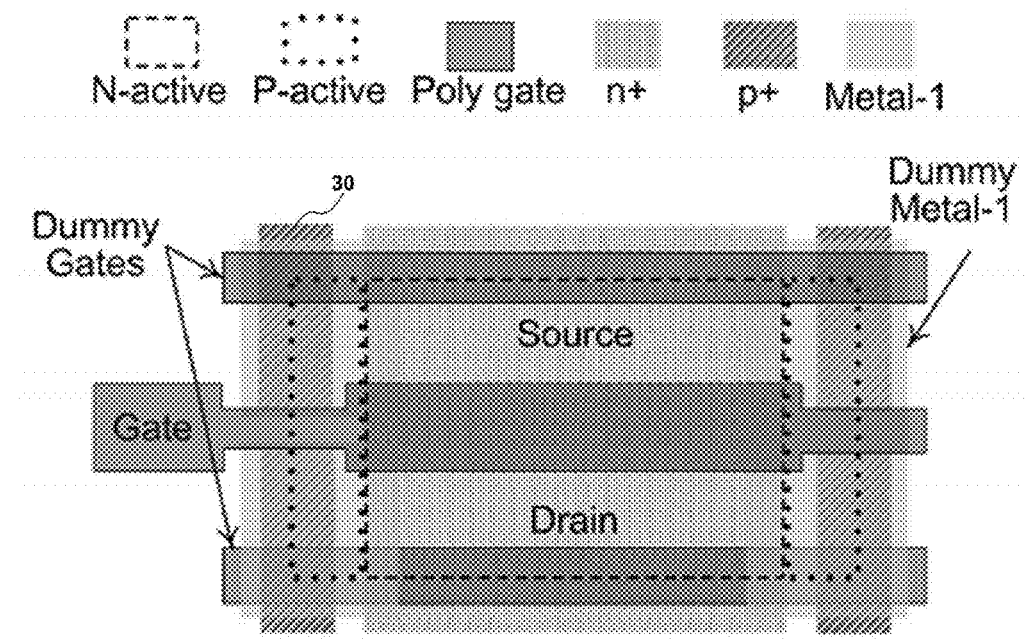
FIG. 11 shows a radiation tolerant DGA n-MOSFET layout according to a seventh embodiment of the present invention.

FIG. 11 shows a radiation tolerant DGA n-MOSFET layout according to the seventh embodiment of the present invention.

Referring to FIG. 11, in the seventh embodiment, when the gate is long in length, two sides of the gate are reduced to minimize an increase in side gate capacitance at the sides. As the sides of the gate do not contribute to actual transistor operation but are used simply as an electrode for voltage application to the central channel region, they may be reduced to the minimum line width. In this case, it is preferable to increase the region of the p+ layer 30 in correspondence with the reduced line width.

Eighth Embodiment

Figure 12:
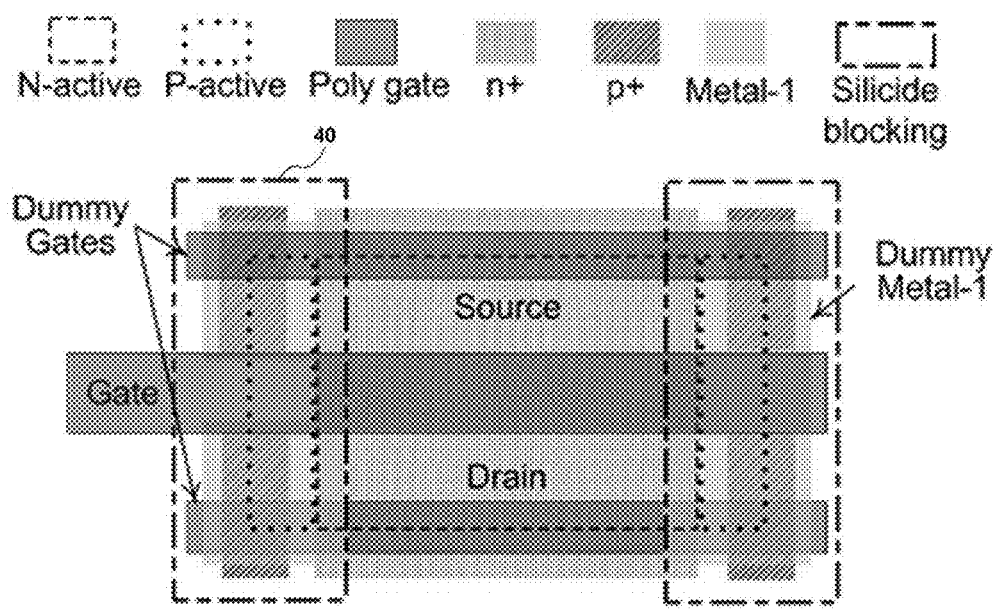
FIG. 12 shows a radiation tolerant DGA n-MOSFET layout according to an eighth embodiment of the present invention.

FIG. 12 shows a radiation tolerant DGA n-MOSFET layout according to the eighth embodiment of the present invention.

Referring to FIG. 12, in the eighth embodiment, a silicide blocking layer 40 is additionally introduced. Most up-to-date semiconductor processes apply a silicide layer to the n+ region and p+ region to reduce contact resistance between electrodes. When a silicide layer is used in the layout proposed by the present invention, the n+ region and the p+ region conduct to each other, causing a problem that the source and the drain conduct to the silicon body. Hence, when a new process using a silicide layer is applied, it is necessary to arrange a silicide blocking layer 40 across the p+ region and n+ region as in the case of the eighth embodiment.

Ninth Embodiment

Figure 13:
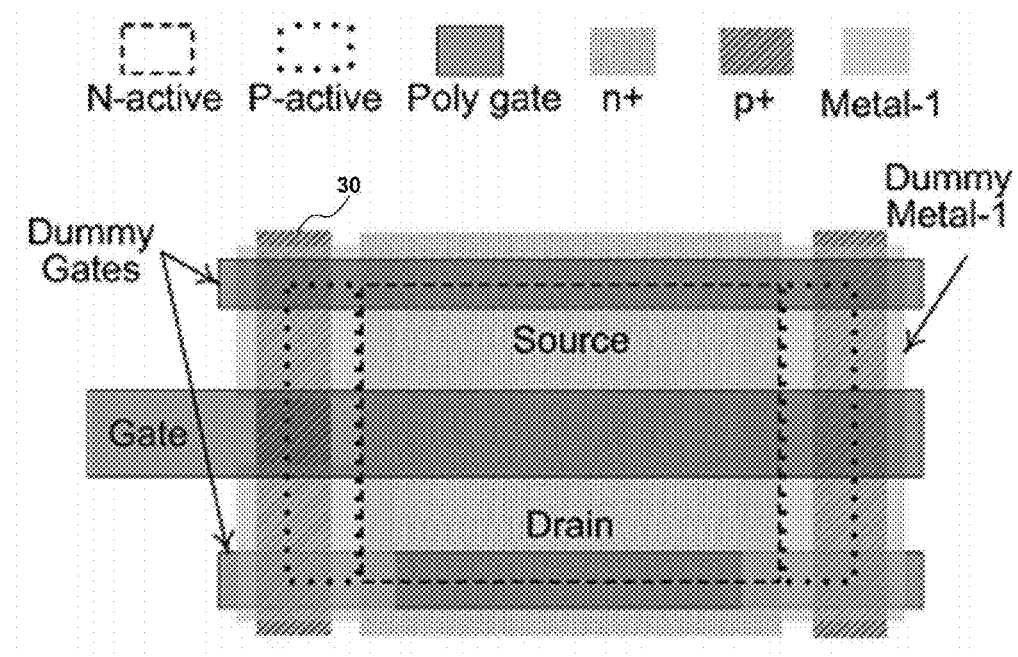
FIG. 13 shows a radiation tolerant DGA n-MOSFET layout according to a ninth embodiment of the present invention.

FIG. 13 shows a radiation tolerant DGA n-MOSFET layout according to the ninth embodiment of the present invention.

Referring to FIG. 13, in the ninth embodiment, the p+ layer 30 is extended so as to overlap with the transistor gate region. In general, when the p+ layer 30 overlaps with the transistor gate region, a pn junction is formed at the gate region and turn-off operation of the transistor may be slowed. Hence, allowing the p+ layer 30 to overlap with the transistor gate region is generally discouraged. However, in a specialized process wherein such a pn junction is of no concern, the p+ layer 30 may be allowed to overlap with the transistor gate. In addition, when the p+ layer 30 overlaps with the transistor gate, the threshold voltage at the gate region overlapping with the p+ layer 30 is raised and hence only a weak channel is induced at the overlapping region, reducing generation of leakage current paths through the channel.

Figure 14:
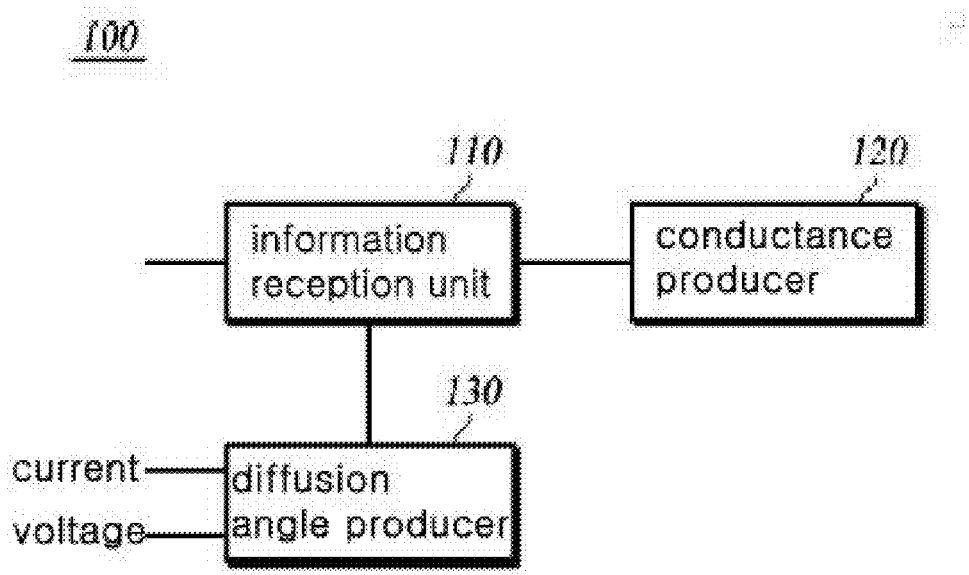
FIG. 14 illustrates a block diagram of a channel modeling apparatus for a semiconductor device according to an embodiment of the present invention.
Figure 15:
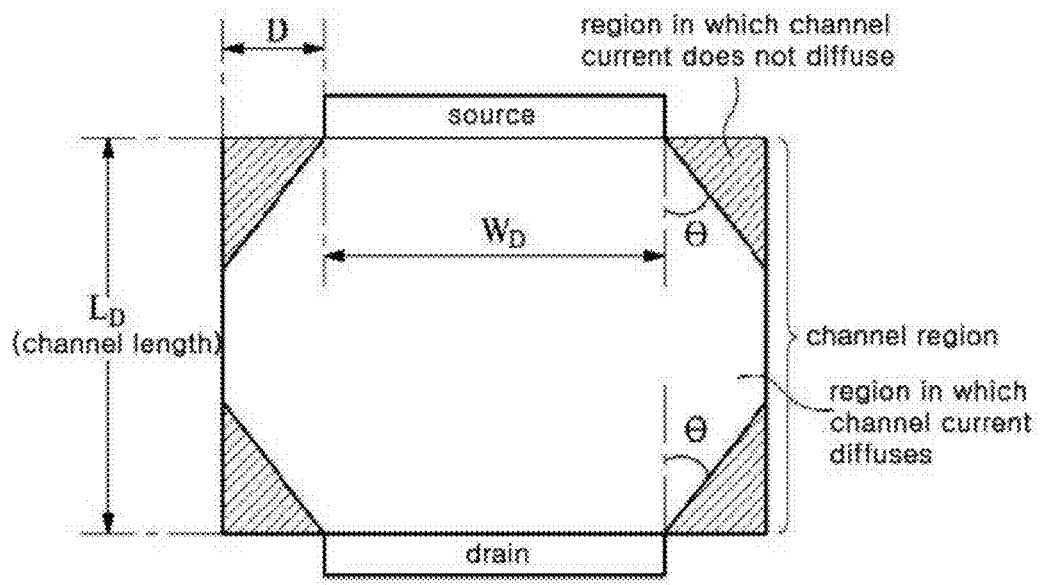
FIG. 15 illustrates a layout of a DGA n-MOSFET semiconductor device to be modeled including drain, source and channel regions.

FIG. 14 illustrates a block diagram of a channel modeling apparatus 100 for a semiconductor device according to an embodiment of the present invention. FIG. 15 illustrates a layout of a DGA n-MOSFET semiconductor device to be modeled including drain, source and channel regions.

Referring to FIG. 14, the channel modeling apparatus 100 for a semiconductor device may include an information reception unit 110 and a conductance producer 120, and may further include a diffusion angle producer 130 if necessary.

The information reception unit 110 receives layout information of a semiconductor device to be modeled such as a DGA n-MOSFET, including information on the length ($L_D$) of the channel region between the drain and source, information on the width ($W_D$) of the drain and source, information on the width (D or D+$W_D$) of the channel region, and information on the diffusion angle (θ) indicating the boundary between a portion in which channel current diffuses from ends of the drain and the source in the width direction and another portion in which channel current does not diffuse in the channel region. Here, the diffusion angle (θ) indicates the angle between the direction of the boundary (between a portion in which channel current diffuses from ends of the drain and the source in the width direction and another portion in which channel current does not diffuse in the channel region) and the direction of the length of the channel region. Such layout information may be directly entered by the user or may be received from a semiconductor design system (not shown), which utilizes the channel modeling apparatus 100 for a semiconductor device.

Figure 16:
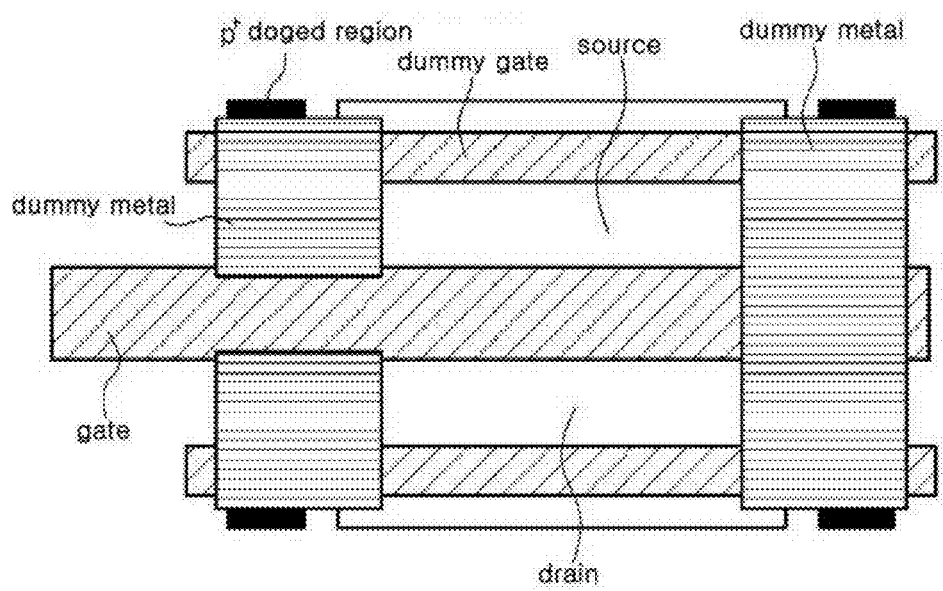
FIG. 16 illustrates a DGA n-MOSFET semiconductor device whose drain, source and channel region are formed as depicted in FIG. 15.

FIG. 16 illustrates a DGA n-MOSFET semiconductor device 300 whose drain, source and channel region are formed as depicted in FIG. 15.

As shown in FIG. 16, the DGA n-MOSFET semiconductor device 300 includes a source, drain, p+ doped region, gate, dummy gate, and dummy metal formed on a p-type substrate.

The DGA n-MOSFET semiconductor device 300 is a radiation tolerant device that is designed to have radiation resistance characteristics by minimizing generation of leakage current from the drain and source when exposed to radiation.

Figure 17:
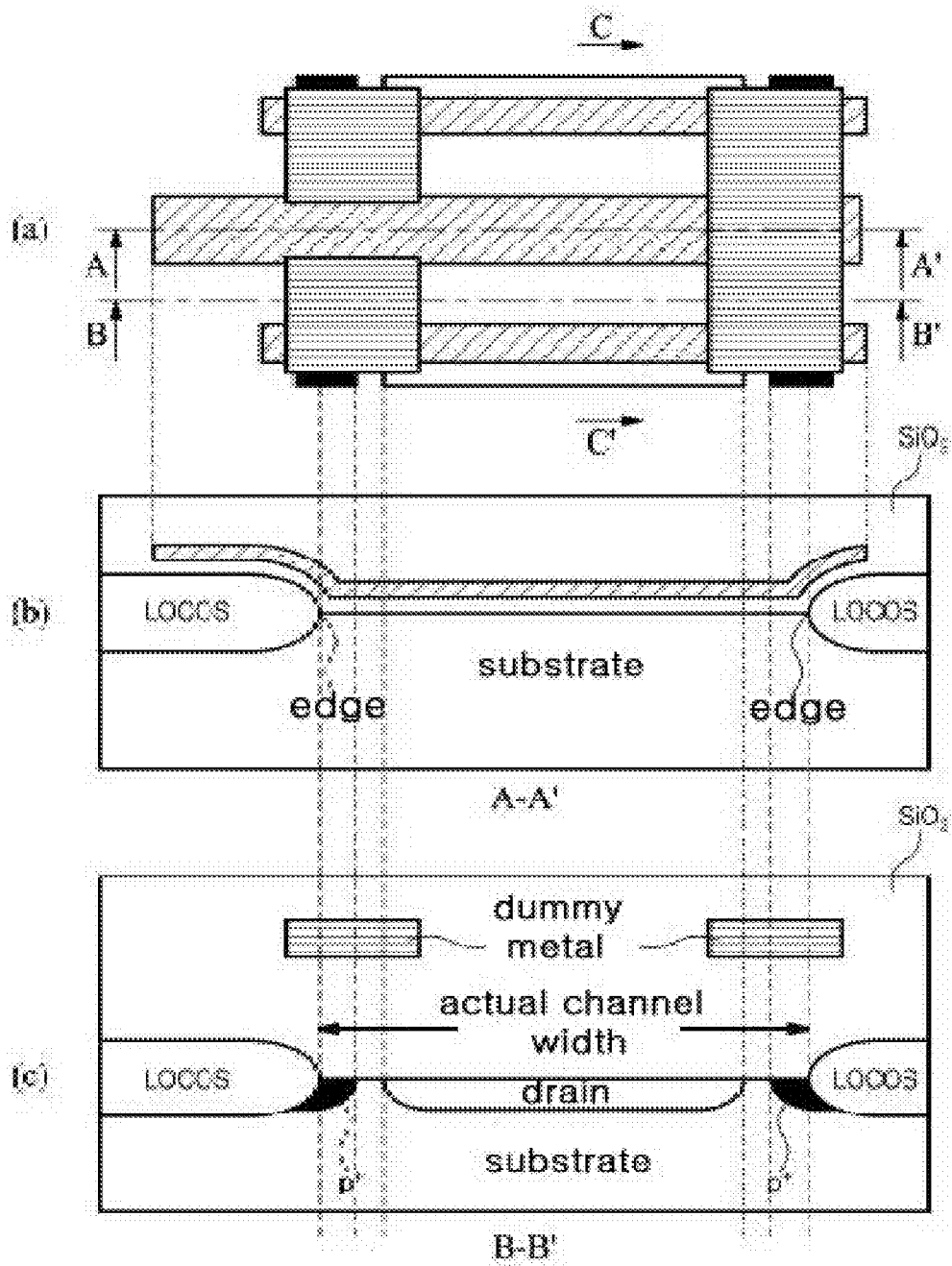
FIG. 17 is views of a DGA n-MOSFET unit device 300, wherein (a) shows section lines A-A', B-B' and C-C', (b) shows a sectional view of the DGA n-MOSFET unit device 300 taken along the section line A-A', and (c) shows a sectional view of the DGA n-MOSFET unit device 300 taken along the section line B-B'.
Figure 18:
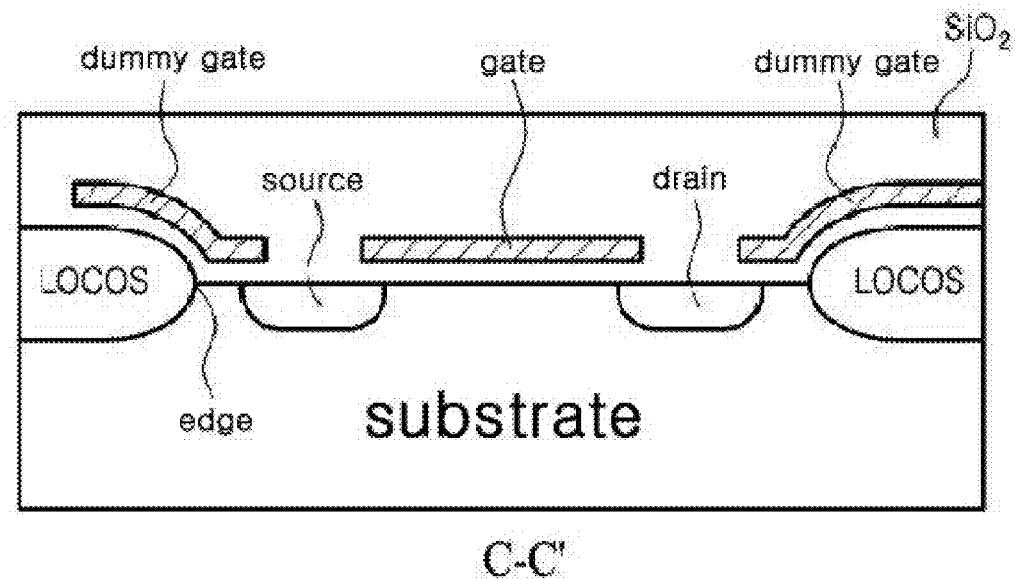
FIG. 18 is a sectional view of the DGA n-MOSFET unit device 300 taken along the section line C-C'.

FIG. 17 is views of a DGA n-MOSFET unit device 300, wherein (a) shows section lines A-A', B-B' and C-C', (b) shows a sectional view of the DGA n-MOSFET unit device 300 taken along the section line A-A', and (c) shows a sectional view of the DGA n-MOSFET unit device 300 taken along the section line B-B'. FIG. 18 is a sectional view of the DGA n-MOSFET unit device 300 taken along the section line C-C'.

The description is continued with reference to FIGS. 17 and 18.

LOCOS structures constitute a boundary between DGA n-MOSFET unit devices 300. As shown in part (b) of FIG. 17, a substrate region in which a channel may be formed is present under the gate between two LOCOS structures.

As shown in part (c) of FIG. 17, the dummy gate is present above the boundary between a LOCOS structure and the substrate surface. Two p+ doped regions are formed respectively at the boundary between the left LOCOS structure and the p-type substrate and at the boundary between the p-type substrate and the right LOCOS structure, and a small gap is maintained between the p+ doped regions and the drain and source regions.

Meanwhile, supplying power so as to maintain a suitable potential difference between the dummy metal and the substrate facilitates recombination of electron-hole pairs generated by radiation at the interface between the LOCOS structure and the substrate, reducing leakage current generated from the drain and source. The p+ doped region may increase the threshold voltage for generation of electron-hole pairs by radiation, further reducing leakage current generated from the drain and source.

As shown in FIG. 18, placement of small gaps between the source and the LOCOS structure and between the drain and the LOCOS structure minimizes influence of leakage current generated by radiation at the edge between the LOCOS structure and the substrate.

Therefore, as shown in part (b) of FIG. 17, the width of the channel region of the DGA n-MOSFET unit device 300 becomes slightly wider than the width of the drain or source. Such an extended channel width is illustrated in the layout of FIG. 15, which is seen from the upper side of the substrate.

As described before, the n-MOSFET having a channel region as depicted in FIG. 15 has a larger W/L ratio in comparison to an existing n-MOSFET. As channel current flows through added regions D, the channel W/L ratio increases. In typical circuit design, operating characteristics of a semiconductor circuit are determined by adjusting the W/L ratio. Hence, to design a circuit using a unit MOSFET having a channel region geometry as depicted in FIG. 15, it is necessary to have a model with an effective W/L ratio suitable for such a channel region geometry.

Figure 19:
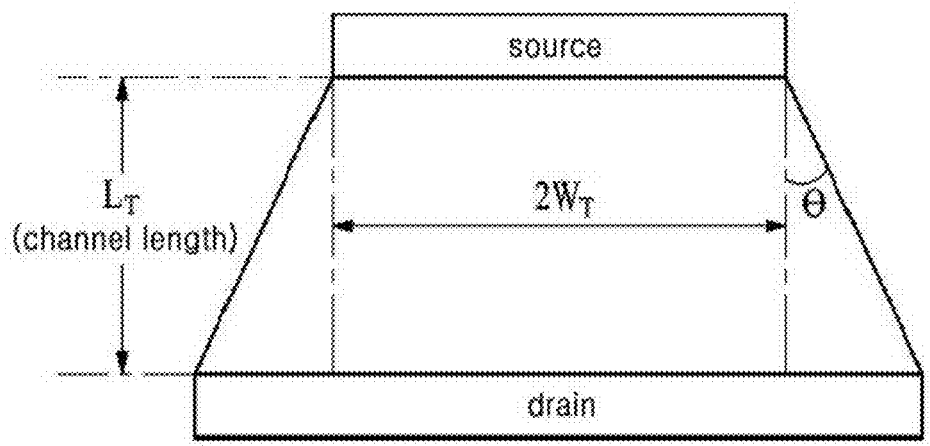
FIG. 19 illustrates a channel of a trapezoidal shape.

FIG. 19 illustrates a channel of a trapezoidal shape.

However, an analytical solution for the W/L ratio of a channel region as depicted in FIG. 15 does not exist. Hence, an embodiment of the present invention proposes a model of an effective W/L ratio for a channel region as depicted in FIG. 15. The proposed model is based on approximation of the analytical solution for a trapezoidal channel as shown in FIG. 19. The effective W/L ratio model for a trapezoidal channel as depicted in FIG. 19 is given by Equation 1.

[Equation 1]

$$\left(\frac{W}{L}\right)_{eff} = \frac{2\theta}{\ln\left(\frac{W_T + L_T * \theta}{W_T}\right)}$$

In Equation 1, $\theta$ is the diffusion angle between the direction of the boundary (between a portion in which channel current diffuses from ends of the drain and the source in the width direction and another portion in which channel current does not diffuse in the channel region) and the direction of the length of the channel.

Figure 20:
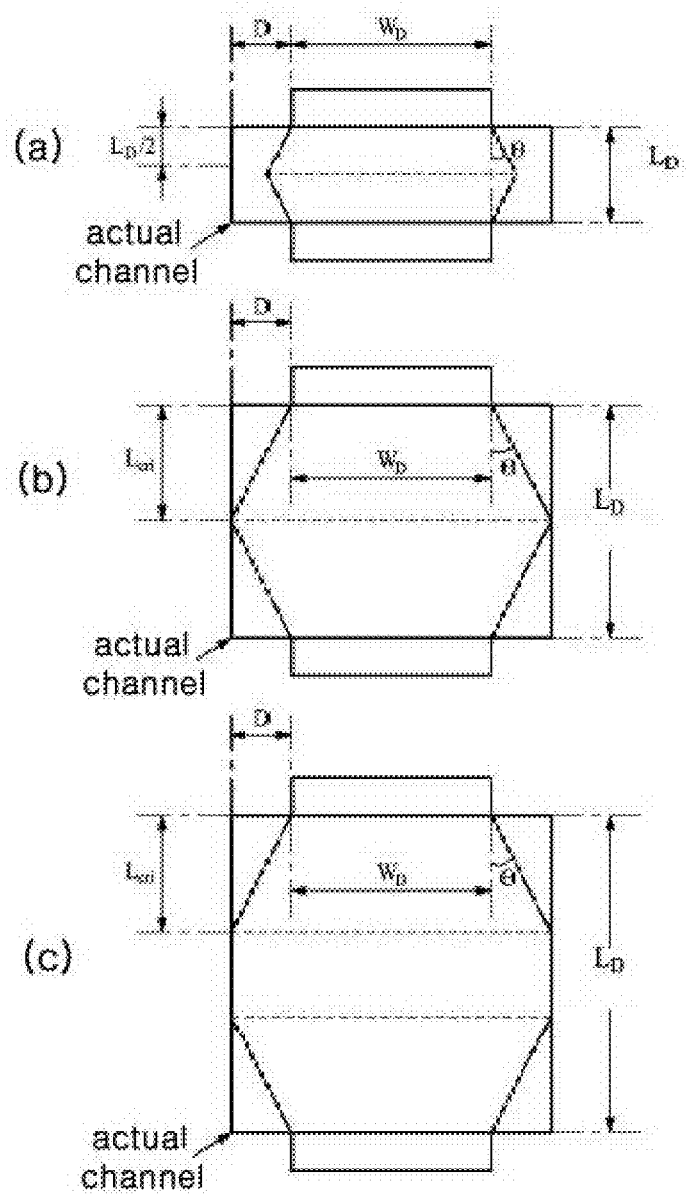
FIG. 20 illustrates final approximate models of effective W/L ratios for different DGA n-MOSFET channel geometries.

FIG. 20 illustrates final approximate models of effective W/L ratios for different DGA n-MOSFET channel geometries.

In embodiments of the present invention, the width of the channel region is greater than the width of the drain and source by a preset length (D) both on the left of the drain and source and on the right of the drain and source. The direction of the length ($L_D$) of the channel region is perpendicular to the direction of the width of the drain and source.

As illustrated in FIG. 20, three channel geometries are considered according to the ratio between the length ($L_D$) of the channel region and the length (D) added to the width of the drain or source, and the effective W/L ratio is computed correspondingly.

Part (a) of FIG. 20 illustrates the shape of a channel region when the value of $L_D \tan \theta/2$ is less than D. In this case, the effective W/L ratio $(W/L)_{eff}$ may be approximately computed using Equation 2.

[Equation 2]

$$\left(\frac{W}{L}\right)_{eff} = \frac{\theta}{\ln\left(\frac{W_D + L_D * \theta}{W_D}\right)}$$

In Equation 2, $W_D$ is the width of the drain and source, $L_D$ is the length of the channel, and $\theta$ is the diffusion angle.

Part (b) of FIG. 20 illustrates the shape of a channel region when the value of $L_D \tan \theta/2$ is equal to D. In this case, the effective W/L ratio $(W/L)_{eff}$ may be approximately computed using Equation 2.

Part (c) of FIG. 20 illustrates the shape of a channel region when the value of $L_D \tan \theta/2$ is greater than D. In this case, a model for the effective W/L ratio $(W/L)_{eff}$ may be derived in such a way that conductance is computed for resistors connected in series. When the DGA n-MOSFET unit device 300 is operated, the effective W/L ratio $(W/L)_{eff}$ has properties similar to those of conductance of resistors. The channel region shown in part (c) of FIG. 20 may be considered as a series combination of component regions (trapezoidal region, rectangular region and trapezoidal region). Hence, the effective W/L ratio of the channel region shown in part (c) of FIG. 20 may be viewed as a series combination of effective W/L ratios of component regions (in other words, combined conductance for a series combination of conductances).

For example, when a channel region with an effective W/L ratio $(W/L)_1$ is connected in series with a channel region with an effective W/L ratio $(W/L)_2$, the effective W/L ratio $(W/L)_{total}$ for the combined channel region may be computed using an equation $(W/L)_{total} = 1/(1/(W/L)_1 + 1/(W/L)_2)$.

Hence, the effective W/L ratio $(W/L)_{eff}$ of the channel region shown in part (c) of FIG. 20 may be may be approximately computed using Equation 3.

[Equation 3]

$$\left(\frac{W}{L}\right)_{eff} = \frac{1}{\frac{1}{A} + \frac{1}{B} + \frac{1}{A}}$$

$$A = \frac{2\theta}{\ln\left(\frac{W_D + 2L_{crt} * \theta}{W_D}\right)}, B = \frac{W_D + 2D}{L_D - 2L_{crt}},$$

$$L_{crt} = D * \tan(90° - \theta)$$

The conductance producer 120 produces conductance information by evaluating given equations (Equation 2 and Equation 3) for layout information received from the information reception unit 110. That is, the effective W/L ratio $(W/L)_{eff}$ computed using Equation or Equation 3 is in proportion to conductance $G_m$ of the channel region of the DGA n-MOSFET unit device 300. As conductance is in proportion to the cross sectional area of the device and is in inverse proportion to the length thereof, the effective W/L ratio $(W/L)_{eff}$ may be considered as information corresponding to conductance $G_m$ of the channel region of the DGA n-MOSFET unit device 300.

Hence, the conductance producer 120 applies different equations according to whether the value $(L_D*\tan\theta)/2$ is greater than the value D. That is, if the value $(L_D*\tan\theta)/2$ is greater than the value D, the conductance producer 120 uses Equation 3 to generate information corresponding to conductance $G_m$ of the channel region of the DGA n-MOSFET unit device 300; and if the value $(L_D*\tan\theta)/2$ is not greater than the value D, the conductance producer 120 uses Equation 2 to generate information corresponding to conductance $G_m$ of the channel region of the DGA n-MOSFET unit device 300.

The diffusion angle producer 130 may compute the diffusion angle by measuring changes in channel current $I_D$ flowing through the channel region according to the magnitude of the gate-source voltage $V_{GS}$ between the gate and source.

The diffusion angle producer 130 may compute the diffusion angle by applying the gate-source voltage $V_{GS}$ of the DGA n-MOSFET unit device 300 and measuring the channel current $I_D$. For example, channel conductance is computed by measuring a change in the channel current $I_D$ according to the magnitude of the gate-source voltage $V_{GS}$; the computed conductance is substituted into the left-hand side $((W/L)_{eff})$ Of Equation 2 or 3; measured or obtained values for the drain and source width $(W_D)$ and channel length $(L_D)$ are substituted into Equation 2 or 3; the resulting equation is simplified with respect to the diffusion angle ($\theta$); and the diffusion angle ($\theta$) is obtained through simulation or analysis.

The diffusion angle is a parameter that may be fixed for the process of fabricating the DGA n-MOSFET unit device 300. Hence, the diffusion angle of a DGA n-MOSFET unit device 300 computed by measuring a change in the channel current $I_D$ according to the magnitude of the gate-source voltage $V_{GS}$ may be utilized for another DGA n-MOSFET unit device fabricated using the same process.

The diffusion angle may be preset for a fabrication process. The user may manually compute the diffusion angle by measuring the channel current $I_D$ after applying the gate-source voltage $V_{GS}$ and utilizing Equation 2 or 3.

Figure 21:
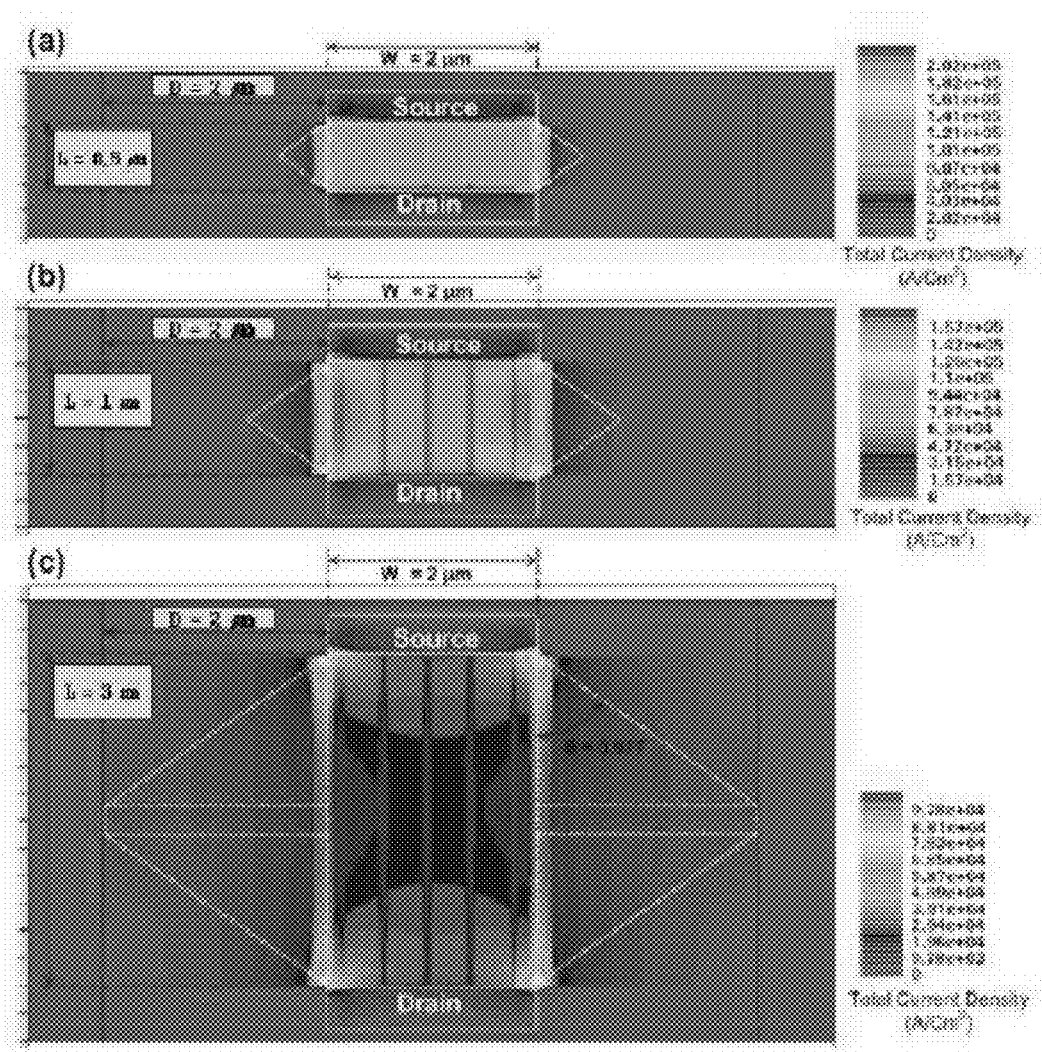
FIG. 21 shows a result of current density simulation at the channel region.

FIG. 21 shows a result of current density simulation at the channel region.

To verify validity of the above assumption, current density is examined at the channel region of the DGA n-MOSFET unit device 300 through three-dimensional simulation.

Part (a) and (b) of FIG. 21 show simulation results for current density at the channel region when the value $(L_D*\tan\theta)/2$ is less than or equal to the value D. Part (c) of FIG. 21 shows a simulation result for current density at the channel region when the value $(L_D*\tan\theta)/2$ is greater than the value D.

Results shown in Part (a), (b) and (c) of FIG. 21 are obtained through channel current density simulation performed when the drain and source width (W) and D are held constant and only the channel length (L) is varied. Namely, the drain and source width (W) was set to 2 μm and D was set to 2 μm for part (a), (b) and (c); and the channel length (L) was set to 0.5 μm for part (a), 1 μm for part (b), and 3 μm for part (c). The simulation results show that current density is significantly low in the vicinity of the four vertices of the channel region.

When the value L is small (0.5 μm), the channel current does not spread from the ends of the drain and source far to the left and right in the channel region. When the value L becomes greater than a certain value, the channel current spreads from the ends of the drain and source far to the left and right in the channel region. This implies that the angle of diffusion of the channel current from the ends of the source in the width direction is maintained constant.

It can be seen that, when the value L is greater than or equal to a threshold value, the channel current spreads over the channel region configured as a combination of a trapezoidal region near to the source, a trapezoidal region near to the drain, and a rectangular region between the two trapezoidal regions. In addition, it may be assumed that the diffusion angle is maintained constant regardless of the channel region structure.

Therefore, it can be seen that the channel region may be modeled according to the three channel shapes as shown in FIG. 20. As described before, the diffusion angle may be determined according to the fabrication process for a given semiconductor device.

Figure 22:
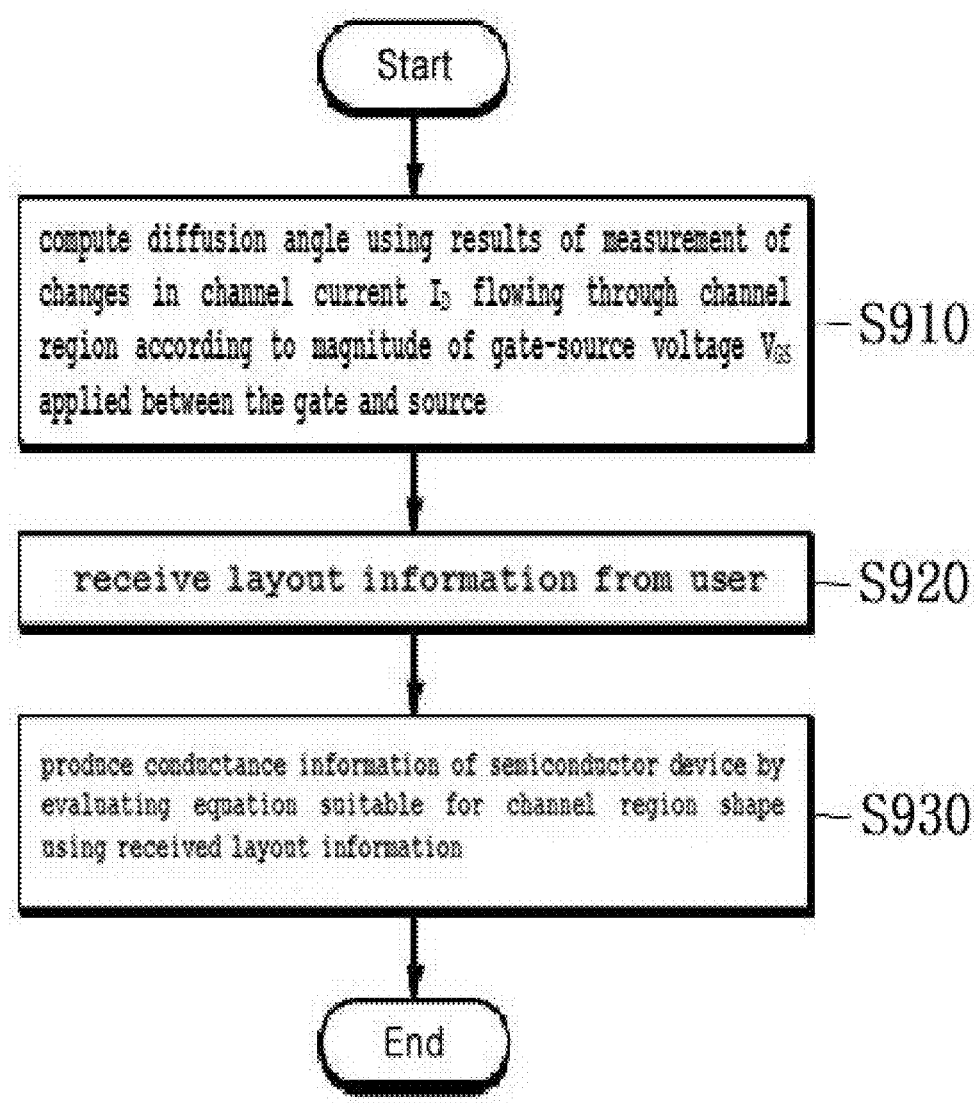
FIG. 22 is a flowchart of a channel modeling method for a semiconductor device according to an embodiment of the present invention.

FIG. 22 is a flowchart of a channel modeling method for a semiconductor device according to an embodiment of the present invention.

The description is continued with reference to FIGS. 14 to 22.

Referring to FIG. 22, in the channel modeling method supported by the channel modeling apparatus 100, the diffusion angle producer 130 computes the diffusion angle using results of measurement of changes in channel current $I_D$ flowing through the channel region according to the magnitude of the gate-source voltage $V_{GS}$ between the gate and source (S910).

The information reception unit 110 receives layout information of the semiconductor device to be modeled such as a DGA n-MOSFET from the user, including information on the length $(L_D)$ of the channel region between the drain and source, information on the width $(W_D)$ of the drain and source, information on the width (D or D+$W_D$) of the channel region, and information on the diffusion angle ($\theta$) indicating the boundary between a portion in which channel current diffuses from ends of the drain and the source in the width direction and another portion in which channel current does not diffuse in the channel region (S920).

Upon reception of the layout information from the information reception unit 110, the conductance producer 120 produces conductance information by evaluating an equation suitable for the channel region shape (Equation 2 or Equation 3) using the received layout information (S930).

The channel modeling method described in FIG. 22 may be implemented as a computer program and may be stored in various computer readable storage media. The computer readable storage medium storing a program implementing the channel modeling method of the present invention may be any type of a storage medium readably by a computer.

Examples of such computer readable storage media may include a ROM, RAM, CD-ROM, magnetic tape, floppy disk, optical disk data storage, and the like. A computer readable storage medium may be connected to a system of computers connected through a network, and a program stored therein may be executed by the computers in a distributed fashion. In addition, codes and code segments constituting the program that implements an embodiment the present invention may be easily inferred by programmers skilled in the art.

Although embodiments of the present invention have been described in detail hereinabove, it should be understood that many variations and modifications of the basic inventive concept described herein will still fall within the spirit and scope of the present invention as defined in the appended claims and their equivalents.

INDUSTRIAL APPLICABILITY

The present invention may contribute to enhancement of semiconductor design efficiency by enabling rapid modeling of electrical characteristics of a semiconductor device to be designed such as a DGA MOSFET when the channel region geometry is diversified according to design of the semiconductor device.

DESCRIPTION OF REFERENCE SYMBOLS

10: dummy metal-1 layer
20: dummy poly gate layer
30: p-active layer and p+ layer
100: channel modeling apparatus for semiconductor device
110: information reception unit
120: conductance producer
130: diffusion angle producer
300: DGA n-MOSFET unit device

What is claimed is:

1. A dummy gate-assisted n-MOSFET having radiation tolerance characteristics, as a unit n-MOSFET that includes an N-active layer designating an active area of the transistor so that an isolation field oxide is not formed in the active area during a process, a poly gate layer designating a gate region of the transistor using poly silicon, and an n+ layer designating highly doped positions of n-type to form the source and the drain through self-alignment, the dummy gate-assisted n-MOSFET comprising:
 a dummy poly gate layer to block leakage current paths by use of a phenomenon that hole trapping is not generated when the thickness of the gate oxide becomes less than or equal to 10 nm; and
 a p-active layer and a p+ layer to block generation of leakage current by raising a threshold voltage so as to suppress channel inversion caused by trapped holes,
 wherein the source and the drain of the transistor are enclosed by the dummy poly gate layer, the p-active layer and the p+ layer so as to block radiation-induced leakage current paths.

2. The dummy gate-assisted n-MOSFET of claim 1, wherein at least one of the p+ layer, which blocks generation of leakage current by raising the threshold voltage so as to suppress channel inversion caused by trapped holes, and a dummy metal-1 layer, which blocks generation of leakage current when a flat band voltage is applied thereto so as to minimize the electric field acting on the oxide and facilitate recombination of most electron-hole pairs generated by radiation, is selectively applied to the p-active layer.

3. The dummy gate-assisted n-MOSFET of claim 2, wherein a flat band voltage or given voltage is applied to the dummy metal-1 layer.

4. The dummy gate-assisted n-MOSFET of claim 1, wherein the active area is extended in two directions toward the dummy poly gate layer so that the dummy poly gate layer is placed in the active area.

5. The dummy gate-assisted n-MOSFET of claim 1, wherein, when the gate length of the transistor is long, the length of the gate region overlapping with the p-active layer is reduced to the minimum line width or to a value less than the original gate length.

6. The dummy gate-assisted n-MOSFET of claim 1, further comprising a silicide blocking layer to block formation of silicide at the p-active layer and the n+ layer when a fabrication process in which a silicide layer is applied to a semiconductor device is used.

7. The dummy gate-assisted n-MOSFET of claim 1, wherein, when the p+ layer is extended so as to overlap with the transistor gate region, a threshold voltage at the gate region overlapping with the p+ layer is raised, only a weak channel is induced at the overlapping region, and generation of leakage current paths through the channel is reduced.

\* \* \* \* \*